United States Patent [19]

Knotter et al.

[11] Patent Number: 5,622,896
[45] Date of Patent: Apr. 22, 1997

[54] METHOD OF MANUFACTURING A THIN SILICON-OXIDE LAYER

[75] Inventors: Dirk M. Knotter; Jacob Wijdenes, both of Eindhoven, Netherlands

[73] Assignee: U.S. Philips Corporation, New York, N.Y.

[21] Appl. No.: 543,565

[22] Filed: Oct. 16, 1995

[30] Foreign Application Priority Data

Oct. 18, 1994 [EP] European Pat. Off. ............... 94203011

[51] Int. Cl.$^6$ .............................. H01L 21/28; H01L 21/56
[52] U.S. Cl. ........................ 438/123; 427/553; 427/558; 29/827
[58] Field of Search ..................... 427/553, 558; 437/201, 211, 220, 231, 238

[56] References Cited

U.S. PATENT DOCUMENTS

| | | | |
|---|---|---|---|
| 3,389,160 | 6/1968 | Reid | 260/448.2 |
| 5,057,336 | 10/1991 | Adachi et al. | 427/44 |
| 5,336,532 | 8/1994 | Haluska et al. | 427/515 |
| 5,385,739 | 10/1994 | Baney et al. | 437/238 |
| 5,387,546 | 2/1995 | Maeda et al. | 457/174 |

FOREIGN PATENT DOCUMENTS

| | | | |
|---|---|---|---|
| 0462715A1 | 12/1927 | European Pat. Off. | H01L 21/312 |
| 0313095A3 | 4/1989 | European Pat. Off. | C07F 7/08 |
| 64-056315 | 3/1989 | Japan. | |
| 01194980 | 8/1989 | Japan. | |
| 2081284 | 2/1982 | United Kingdom. | |

OTHER PUBLICATIONS

"Synthesis, Characterization, Stability, Aqueous Surface Activity . . . ", S.A. Snow in Langmuir, 1993, 9, pp. 424–430.

*Primary Examiner*—John Niebling
*Assistant Examiner*—Thomas G. Bilodeau
*Attorney, Agent, or Firm*—Michael E. Schmitt

[57] ABSTRACT

A method of providing an ultra-thin (<1 nm) silicon-oxide layer on a substrate surface, for example, of a metal. A film of a solution of a polyorganosiloxane is applied to the substrate surface. After drying, the polyorganosiloxane is completely converted to said silicon-oxide layer by means of an UV-ozone treatment. Such an ultra-thin silicon-oxide layer sufficiently protects a metal surface against corrosion. In addition, the silicon-oxide layer can be silanized with the customary silane coupling agents to improve the bond with polymers. The method can very suitably be used, for example, to treat metal leadframes for ICs and to provide a bonding layer for indium tin oxide on polyacrylate for a passive plate of LC displays.

11 Claims, 1 Drawing Sheet

METHOD OF MANUFACTURING A THIN SILICON-OXIDE LAYER

BACKGROUND OF THE INVENTION

The invention relates to a method of applying a silicon-oxide layer to a substrate, in which method a film of a solution of a polyorganosiloxane in a solvent is applied to a surface of said substrate, whereafter the film is dried, thereby forming a polyorganosiloxane layer which is subsequently converted to said silicon-oxide layer. Such a layer is used, inter alia, as an anti-corrosive or passivating layer on metal surfaces, in particular, of parts of semiconductor devices.

Such a method is known from U.S. Pat. No. 5,057,336. In said known method, a 5 to 30 wt. % solution of a polyorganosiloxane in an organic solvent is provided on a substrate surface, for example, by means of spin coating. The film obtained is dried at an increased temperature, subsequently, heated to a temperature between 100° and 200 ° C. and finally to a temperature between 350° and 450 ° C. for 60 to 90 minutes. The polyorganosiloxane layer thus obtained has a thickness of 0.4 to 1.5 µm. Subsequently, the layer thus obtained is subjected to an RF oxygen plasma in pure oxygen at a reduced pressure of approximately 1 mbar (1 Torr) for 20 to 30 minutes. Meanwhile, the substrate is heated to a temperature between 200° and 300 ° C. This treatment causes the polyorganosiloxane layer to be converted to a pure $SiO_2$ layer. The layer thickness of the silicon-oxide layer obtained in accordance with the known method is 0.7 µm.

Said known method has a number of disadvantages. It has to be carried out at a high temperature, which is undesirable for certain applications. Particularly metal substrates can oxidize at these high temperatures. In addition, the known method requires expensive vacuum equipment to carry out the plasma treatment. A further disadvantage of the known method is that the silicon-oxide layer obtained is too thick for many applications, in particular applications in which the silicon-oxide layer should hardly, or not at all, adversely affect the electrical resistance.

SUMMARY OF THE INVENTION

It is an object of the invention to provide, inter alia, a simple method of applying a silicon-oxide layer to a substrate, which method can be carried out in a relatively short period of time at room temperature and at atmospheric pressure. In addition, it should not be necessary to use expensive vacuum equipment to carry out the method. The method must also be suitable for the manufacture of a (sub-)monolayer of silicon oxide having a maximum thickness of 1 nm (0.001 µm). Such a thin silicon-oxide layer must additionally protect the underlying substrate surface, for example, of a metal against corrosion and exhibit a very low electrical resistance. The silicon-oxide layer obtained must bond well, for example, to surfaces of metal such as copper and molybdenum, and be suitable for silanization with the known silanes.

These objects are achieved by a method as described in the opening paragraph, which is characterized in accordance with the invention in that after drying of the polyorganosiloxane layer formed, this layer is rinsed with a solvent and converted to said silicon-oxide layer by means of an UV-ozone treatment.

The dried polyorganosiloxane layer must be rinsed with a solvent to obtain a ultra-thin silicon-oxide layer. The solvent used is one in which the excess polyorganosiloxane dissolves on the substrate surface. The polyorganosiloxane adsorbed at the substrate surface is not rinsed off. For rinsing use can be made of the same solvents as for the preparation of the solution of polyorganosiloxane. Suitable solvents are, for example, alcohols such as 2-propanol; ketones such as methyl ethyl ketone; aliphatic hydrocarbons such as n-hexane and aromatic hydrocarbons such as toluene. When use is made of the cationic polysiloxanes which will be described hereinbelow, water can be used as the solvent and as the rinsing agent. Rinsing of the substrate surface can for example be carried out by immersing it in the relevant solvent for a few seconds.

Conversion of the polyorganosiloxane layer to the silicon-oxide layer takes place by means of an UV-ozone treatment, for example, for 10 minutes. This treatment can take place in air at room temperature and at atmospheric pressure. In this treatment, the polyorganosiloxane layer is exposed in a reactor to ozone and simultaneously irradiated with UV light having a wavelength of 254 nm. In this process, ozone gas can be separately introduced into the reactor. It is easier to use a commercially available UV-ozone reactor which comprises a low-pressure mercury vapour discharge lamp which emits two relevant wavelengths, namely 185 nm and 254 nm. UV light having a wavelength of 185 nm is absorbed by molecular oxygen from the ambient air and generates ozone gas, which subsequently absorbs the 254 nm radiation, thereby forming atomic oxygen. Oxidation to silicon oxide takes place more rapidly at an increased temperature; however, above 70° C. there is no noticeable further acceleration.

Polyorganosiloxanes are polymers which are composed of a chain of alternately Si and O with one or two organic groups attached to each Si atom. Examples of polyorganosiloxanes having one organic group per Si atom are silicone ladder polymers as described in the above-mentioned American Patent U.S. Pat. No. 5,057,336. Each Si atom comprises one alkyl group or one phenyl group and is bonded via an oxygen bridge to a second alternating chain of Si and O. Polyorganosiloxanes having two organic groups per Si atom are often termed polydiorganosiloxanes. Examples of organic groups are alkyl groups and phenyl groups. Said organic groups can be identical or different. In addition to allkyl groups or phenyl groups, a so-called end group such as a hydroxyl, alkyl, amino, dialkylamino, vinyl or (meth)acryloxy group is also attached to the Si atom at the two ends of the polymeric chain. The end groups of the polyorganosiloxanes are selected so as to be compatible with the substrate used. An example of a polydiorganosiloxane is poly(dimethyl siloxane), also referred to as silicone oil.

Another class of suitable polydiorganosiloxanes is formed by the cationic polysiloxane soaps (suffactants), as described in U.S. Pat. No. 3,389,160 and in an article by S. A. Snow in Langmuir, 1993, 9, pp. 424–430. Apart from alkyl groups, these polysiloxanes also comprise positively charged quaternary ammonium groups having a negatively charged counterion. These polysiloxanes can be dissolved in water.

The method in accordance with the invention is preferably carried out with solutions having a polyorganosiloxane concentration in the solvent of 0.05 to 5 wt. %. Such diluted solutions yield very thin silicon-oxide layers, that is, layers having a thickness of maximally 1 nm (0.001 µm), also referred to as monolayers. Surprisingly, it has been found that also such a very thin silicon-oxide layer sufficiently protects an underlying metal surface against corrosion. In addition, such a thin layer hardly, if at all, leads to an increase of the electrical resistance between an underlying metal surface and a conductor which contacts the silicon-oxide layer.

The simplest polyorganosiloxane which can suitably be used in the method in accordance with the invention is poly(dimethyl siloxane).

A polyorganosiloxane comprising phenyl groups is more rapidly oxidized to silicon oxide than a polyorganosiloxane comprising methyl groups. However, polysiloxane comprising only phenyl groups is less soluble in the customary organic solvents. For this reason, the method in accordance with the invention preferably uses poly(methyl phenyl siloxane), whether or not mixed with poly(diphenyl siloxane).

Preferably, a polyorganosiloxane comprising silanol end groups is used, i.e. the Si atoms at the ends of the polymeric chains comprise hydroxyl groups. Such polyorganosiloxanes have better film-forming properties and can be provided in thinner layers on a substrate surface.

The film of said polyorganosiloxane can be applied to the substrate surface by means of dip coating, spraying, atomizing or printing. If the surface is flat, the film is preferably provided by means of spin coating at a speed of rotation between 1000 and 3000 r.p.m. The layer thicknesses of the polysiloxane layer and the silicon-oxide layer formed therefrom decrease as the rotational speed increases and remain constant from 2000 revolutions per minute.

Drying of the film, in which process the solvent is evaporated, can be carried out at room temperature or more rapidly at an increased temperature, for example at 80° C. for 5 minutes.

The method in accordance with the invention is very suitable for applying very thin silicon-oxide layers to substrate surfaces of metal such as copper, molybdenum, iron, nickel and zinc or alloys of said metals. An example of a substrate comprising copper or a copper-iron alloy is a leadframe on which a semiconductor device (IC) is mounted. A monolayer of silicon oxide sufficiently protects the leadframe against corrosion at an increased temperature of approximately 200° C., as occurs during mounting of an IC on the leadframe by means of an epoxy adhesive and, subsequently, during encapsulating the leadframe in an epoxy resin. The electrical resistance of the leadframe is not adversely affected by the monolayer of silicon-oxide.

The method in accordance with the invention can also be used to apply very thin silicon-oxide layers to substrates made of materials other than metal, such as glass and polymer substrates. For example, a bonding layer of silicon oxide is provided on an acrylate top coating of a passive plate of a liquid-crystal display device to improve the adhesion of the ITO (indium-tin oxide) electrode layer.

Another application of the method in accordance with the invention is the corrosion protection of molybdenum tracks on panels of thin liquid-crystal display devices (LCTV), ICs being secured to said tracks by means of a thermosetting epoxy adhesive. Said very thin silicon-oxide layer does not lead to a noticeable increase in electrical resistance. Strangely enough, molybdenum is maximally protected against corrosion if the silicon oxide formed is rinsed with water.

The method in accordance with the invention additionally makes it possible to chemically modify said silicon-oxide layer by means of silane coupling agents known to be used for silicon-oxide surfaces. Since the silicon-oxide layer bonds very well to the metal surface, a good bond between the metal surface and an organic polymer, for example an epoxy resin, is obtained. The silicon-oxide layer additionally provides a good protection against corrosion. Known silane coupling agents do not react directly with metal surfaces, such as surfaces of copper or molybdenum, yet they do react with a silicon-oxide layer provided on said surfaces. After a silicon-oxide layer has been provided on the metal surface by means of a method in accordance with the invention, all known silane coupling agents for silicon oxide can be used.

Examples of suitable silane coupling agents are the bifunctional organosilanes of the general formula:

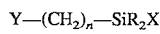

wherein X represents a hydrolyzable group, such as —OCH$_3$, —OC$_2$H$_5$ or —Cl; n=1, 2 or 3; R=X or a lower alkyl group, and Y represents a functional group which can react with a polymer layer to be applied. The X-group reacts with a silanol group of the silicon-oxide surface and forms a covalent bond therewith. If the layer to be provided is an epoxy resin, then the Y-group preferably is an epoxy group or amino group. In this manner, a suitable bond is formed between the epoxy resin and the metal surface.

Examples of suitable silanes for modifying the silicon-oxide surface are water-soluble amino silanes comprising at least one alkoxy group. Said silanes correspond to the formula:

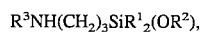

wherein
$R^1$=CH$_3$, C$_2$H$_5$, methoxy or ethoxy, and
$R^2$=CH$_3$ or C$_2$H$_5$
$R^3$=H, CH$_3$, C$_2$H$_5$ or (CH$_2$)$_m$NHR$^4$
$R^4$=H, CH$_3$ or C$_2$H$_5$, and
m=1, 2 or 3.

Suitable representatives are 3-aminopropyl triethoxysilane and N-(2-aminoethyl)-3-aminopropyl trimethoxysilane. Use can also suitably be made of 3-aminopropyl dimethyl methoxysilane. The concentration of the relevant silane in water is not critical and ranges, for example, between 0.1 and 3 wt. %. One of the alkoxy groups of the silane molecule reacts with a silanol group of the silicon-oxide surface, thereby forming a covalent chemical bond.

A suitable organosilane comprising an epoxy group is, for example, 3-(glycidoxypropyl)-trimethoxysilane.

BRIEF DESCRIPTION OF THE DRAWINGS

These and other aspect of the invention will be apparent from and elucidated with reference to the embodiments described hereinafter.

In the drawings.

DETAILED DESCRIPTION OF THE PREFERRED EMBODIMENTS

Figure 1:
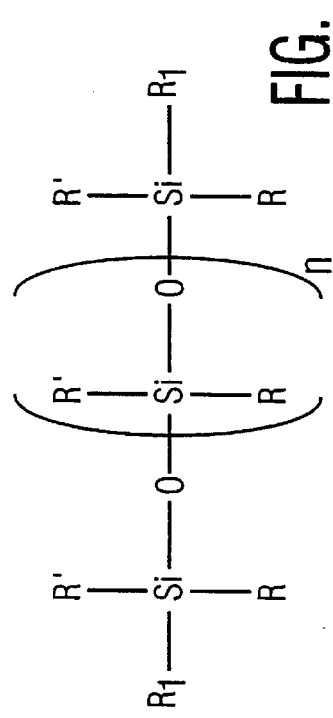
FIG. 1 shows the structural formula of a polyorganosiloxane.

FIG. 1 shows the general structural formula of polyorganosiloxanes as used in the method in accordance with the invention. In this formula, R and R' represent a lower alkyl group, such as methyl and ethyl, or a phenyl group. R and R' may be identical or different. The terminal group R$_1$ represents a methyl group, hydroxyl group, amino group or a $C_1$–$C_2$ dialkyl amino group. In this formula, n=2 to 4000. Preferably, n=50 to 1000 because of the solubility in solvents and the film-forming properties.

A copper plate of 15×8 mm² is cleaned by successively immersing it in diluted hydrochloric acid (1 mol/l), demineralised water, ethanol and hexane. In the final cleaning step, the copper plate is subjected to an UV/ozone treatment for 10 minutes in a commercially available reactor (supplier UVP, type PR 100).

A solution consisting of 0.1 wt. % poly(dimethyl siloxane) (type PS 345.5, supplier Hüls) in methyl ethyl ketone is prepared. The structural formula of this polyorganosiloxane corresponds to that shown in FIG. 1, wherein R=R'=$CH_3$ and $R_1$=OH. The weight-averaged molecular weight is 77,000.

This solution is spin coated onto the copper plate at a rotational speed of 1500 r.p.m. for 30 seconds. The film obtained is heated to 80° C. for 5 minutes, whereafter said film is rinsed with methyl ethyl ketone.

The copper plate carrying the polyorganosiloxane layer is exposed to an UV/ozone treatment in the above reactor for 15 minutes. During this time, the polyorganosiloxane layer is completely converted to a silicon-oxide layer. This complete conversion is demonstrated by SSIMS analysis (Static Secondary Ion Mass Spectroscopy) of the copper surface treated. In this analysis, the surface is bombarded with a beam of primary, low-dose $Ar^+$ ions ($10^{12}$ ions $cm^{-2}$) having an energy of 10 keV and a beam diameter of 50 µm. The generated secondary ions are accelerated to a few keV and then separated in a time-of-flight mass spectrometer.

RBS (Rutherford Back Scattering) analysis, carried out with $^4He^+$ ions having an energy of 2 MeV, shows that approximately a monolayer of silicon oxide ($10^{15}$ atoms per $cm^2$) is present on the copper surface. The layer thickness of the silicon-oxide layer is maximally 1 nm.

The copper plate carrying the ultra-thin silicon-oxide layer is placed in a furnace at a temperature of 160° C. for 10 minutes. After this treatment, the copper plate has retained its original copper colour. RBS analysis shows that the quantity of CuO on the copper surface has not increased. The thin silicon-oxide layer excellently protects the copper surface against corrosion.

Exemplary embodiment 2

Exemplary embodiment 1 is repeated with a polyorganosiloxane of the type PS 162 (supplier Hüls). This polyorganosiloxane comprises 45 wt. % of a polyorganosiloxane in accordance with FIG. 1, wherein R'=phenyl and $R_1$=R= methyl, and 55 wt. % of a polyorganosiloxane, wherein R'=R=phenyl and $R_1$=methyl.

SSIMS analysis shows that oxidation of this polyorganosiloxane layer to the silicon-oxide layer by means of said UV/ozone treatment takes place within 5 minutes.

Comparative example 1 (not in accordance with the invention)

A second copper plate is cleaned in accordance with the above-mentioned method. Subsequently, said plate, which is not provided with a polyorganosiloxane layer, is placed in a furnace at a temperature of 160° C. for 10 minutes. After this process, a greatly discoloured copper plate is obtained, which indicates that oxidation has taken place. RBS analysis shows that the quantity of CuO on the copper surface has doubled.

Comparative example 2 (not in accordance with the invention)

A third copper plate is cleaned and provided with a layer of poly(dimethyl siloxane), as described in exemplary embodiment 1. Heating to 80° C. and rinsing with methyl ethylketone also take place. The UV/ozone treatment is dispensed with, so that the conversion of poly(dimethyl siloxane) to silicon-oxide does not take place.

The copper plate thus treated is placed in a furnace at a temperature of 160° C. for 10 minutes. The copper plate obtained after this process has discoloured just as much as the untreated plate of comparative example 1.

Exemplary embodiment 3.

Figure 2:
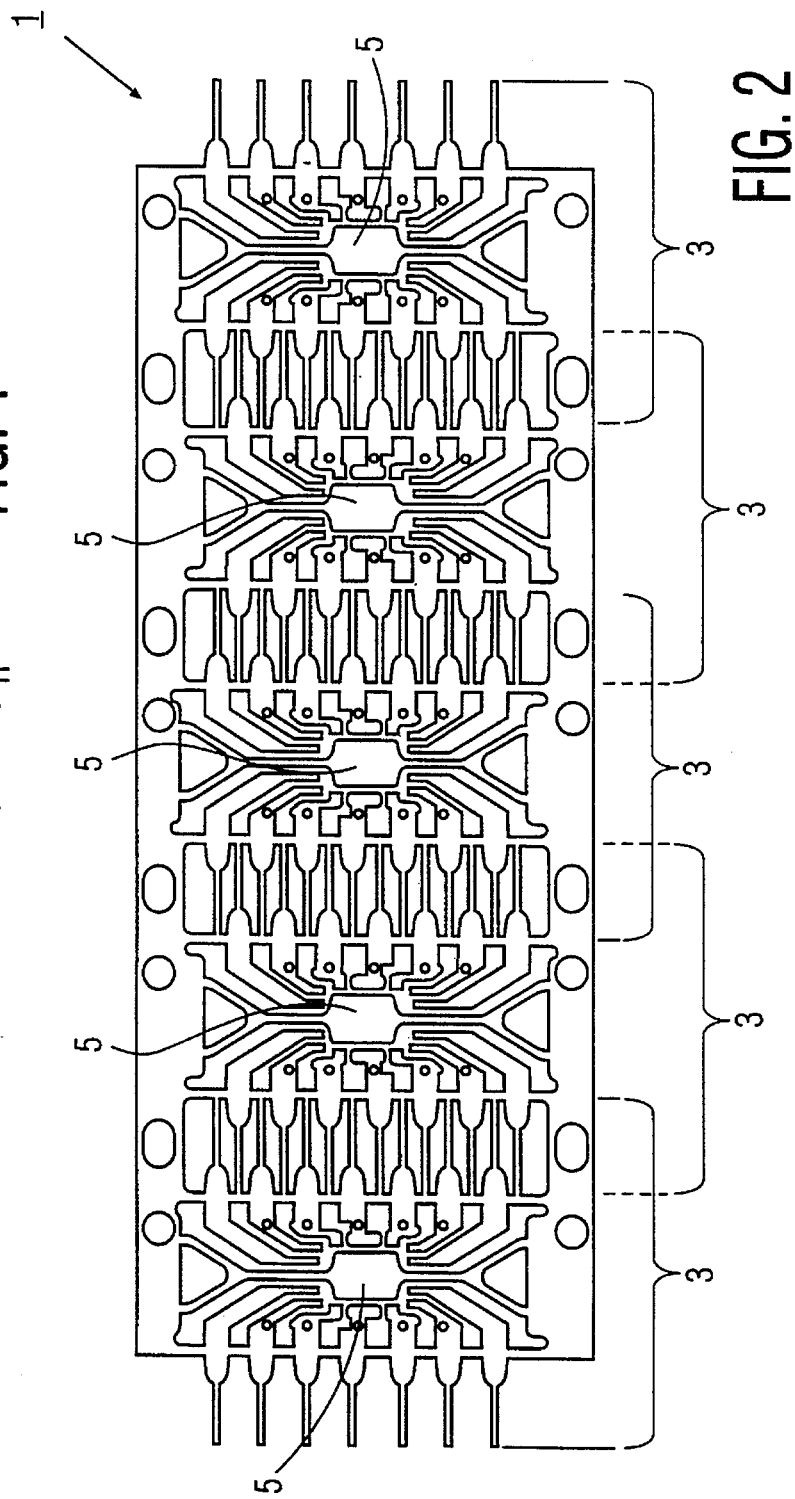
FIG. 2 is a plan view of a part of a strip of copper leadframes, which strip is treated by the method in accordance with the invention.

In FIG. 2, reference numeral 1 denotes a plan view of a part of a strip of interconnected copper leadframes 3. At a later stage, ICs are glued, for example with an epoxy resin, to the central rectangular faces 5 of the leadframe 3. After the ICs and the leadframe are electrically interconnected, the assembly is encapsulated in a thermosetting epoxy resin in a customary manner.

Said strip 1 is provided with a very thin (<1 nm) silicon-oxide layer by means of a method in accordance with the invention. The polyorganosiloxane film can be applied, for example, by dipping into the relevant polyorganosiloxane solution. The silicon-oxide layer protects the leadframe against corrosion. In addition, said silicon-oxide layer can be silanized in a customary manner, for example with 3-aminopropyl trimethoxysilane, to improve the bond between the leadframe and the epoxy resin in which the assembly is encapsulated.

Exemplary embodiment 4

Plates of copper and molybdenum are provided with a monolayer of silicon oxide, as described in exemplary embodiment 1. Bumps of an electroconductive epoxy resin (type EPO-TEK H20E by Epoxy Technology, Inc.) filled with silver are provided on these plates and cured. The electrical resistance is measured between these bumps.

A comparison with plates which are not provided with a silicon-oxide layer shows that said layer does not lead to an increase of the electrical resistance.

After ageing of the molybdenum plate having bumps at room temperature for one day, a change in resistance between the bumps is not observed. An identical molybdenum plate without silicon-oxide layer exhibits an increase in resistance between the bumps of 20 to 35% after the same ageing treatment.

Exemplary embodiment 5

A film of a solution of 3 wt. % poly(dimethyl siloxane) in methyl ethyl ketone is spin coated onto a substrate of polyacrylate. Said film is heated to 80° C. for 5 minutes, whereafter the film is rinsed with methyl ethyl ketone. The substrate carrying the polysiloxane layer is exposed to an UV/ozone treatment for 30 minutes, as a result of which this layer is convened to a silicon-oxide layer having a thickness of less than 1 nm.

A layer of ITO (indium tin oxide) is sputtered onto the silicon-oxide layer formed. Said ITO layer can now be structured by means of etching, without this leading to bonding problems between the ITO layer and the polyacrylate. Such structures are used in the passive plate of LC displays. By virtue of said silicon-oxide layer manufactured by a method in accordance with the invention, sputtering of a silicon-oxide layer in expensive vacuum equipment can be dispensed with.

The method in accordance with the invention enables metal surfaces to be protected against corrosion in a simple manner. The method in accordance with the invention can be carried out at room temperature and at atmospheric pressure in a short period of time. Said method does not require expensive vacuum equipment. The applied, ultra-thin silicon-oxide layer (approximately a monolayer) bonds well to the metal surface and, in addition, can be modified with the silane coupling agents customarily used for silicon oxide to improve the bond between the metal surface and polymers such as epoxy resins.

What is claimed is:

1. A method of applying a silicon-oxide layer to a substrate, in which method a film of a solution of a polyorganosiloxane in a first solvent is applied to a surface of said substrate, whereafter the film is dried, thereby forming a polyorganosiloxane layer which is subsequently rinsed with a second solvent and then converted to said silicon-oxide layer by means of an UV-ozone treatment.

2. A method as claimed in claim 1, wherein a concentration of 0.05 to 5 wt. % polyorganosiloxane in the first solvent is used.

3. A method as claimed in claim 1, wherein a poly(dimethyl siloxane) is used as the polyorganosiloxane.

4. A method as claimed in claim 1, wherein a mixture comprising poly(methyl phenyl siloxane) is used as the polyorganosiloxane.

5. A method as claimed in claim 1, wherein the polyorganosiloxane comprises a silanol terminal group.

6. A method as claimed in claim 1, wherein the film is applied by spin coating.

7. A method as claimed in claim 1, wherein copper or molybdenum is used as the substrate.

8. A method as claimed in claim 2, wherein the silicon-oxide layer has a maximum thickness of 1 nm.

9. A method as claimed in claim 1, wherein the silicon-oxide layer is silanized with a bifunctional organochlorosilane or organoalkoxysilane with an amino group or epoxy group.

10. A method of manufacturing a semiconductor device comprising an integrated circuit which is encapsulated in a synthetic resin and which is mounted on a metal leadframe, said leadframe being previously provided with a silicon-oxide layer by means of a method as claimed in claim 1.

11. A method of manufacturing a passive plate of a liquid-crystal display device, in which method a layer of polyacrylate is provided with a silicon-oxide bonding layer and, subsequently, with an electrode layer of indium tin oxide, said silicon-oxide layer being manufactured by a method as claimed in claim 1.

* * * * *